United States Patent
Lee

(10) Patent No.: US 10,401,556 B2
(45) Date of Patent: Sep. 3, 2019

(54) LIGHT SOURCE MODULE AND BACKLIGHT UNIT HAVING THE SAME

(71) Applicant: Seoul Semiconductor Co., Ltd., Ansan-si (KR)

(72) Inventor: Yoon Seop Lee, Ansan-si (KR)

(73) Assignee: Seoul Semiconductor Co., Ltd., Ansan-si (KR)

( * ) Notice: Subject to any disclaimer, the term of this patent is extended or adjusted under 35 U.S.C. 154(b) by 579 days.

(21) Appl. No.: 15/025,457

(22) PCT Filed: Sep. 30, 2014

(86) PCT No.: PCT/KR2014/009214
§ 371 (c)(1),
(2) Date: Jun. 22, 2016

(87) PCT Pub. No.: WO2015/047035
PCT Pub. Date: Apr. 2, 2015

(65) Prior Publication Data
US 2016/0306101 A1    Oct. 20, 2016

(30) Foreign Application Priority Data

Sep. 30, 2013 (KR) .................. 10-2013-0116633
Sep. 30, 2014 (KR) .................. 10-2014-0131772

(51) Int. Cl.
*F21V 8/00* (2006.01)
*H01L 33/60* (2010.01)
(Continued)

(52) U.S. Cl.
CPC .......... *G02B 6/0073* (2013.01); *G02B 6/0021* (2013.01); *G02B 6/0031* (2013.01);
(Continued)

(58) Field of Classification Search
CPC ....... H01L 33/60; H01L 33/62; H01L 33/505; G02B 6/0021; G02B 6/0031; G02B 6/0068; G02B 6/0073; G02B 6/0083
See application file for complete search history.

(56) References Cited

U.S. PATENT DOCUMENTS 7,293,906 B2   11/2007   Mok et al.
9,910,202 B2    3/2018   Ahn et al.
(Continued)

FOREIGN PATENT DOCUMENTS

CN    1912713      2/2007
CN    101806977    8/2010
(Continued)

OTHER PUBLICATIONS

International Search Report dated Jan. 12, 2015, in International Patent Application No. PCT/KR2014/009214.
(Continued)

*Primary Examiner* — Peniel M Gumedzoe
(74) *Attorney, Agent, or Firm* — H.C. Park & Associates, PLC

(57) ABSTRACT

The present invention relates to a light source module, which has excellent lighting efficiency and is slim, and a backlight unit having the same. The present invention comprises a light emitting unit electronically connected to a substrate through a bottom surface; a wavelength conversion unit formed on the light emitting unit; and a reflection unit formed on the light emitting unit, wherein the reflection unit has a light emitting surface through which light from the light emitting unit is emitted, the light emitting surface being formed by exposing at least one surface of the wavelength conversion unit.

14 Claims, 5 Drawing Sheets

(51) Int. Cl.
  *H01L 33/62* (2010.01)
  *H01L 33/50* (2010.01)
  *H01L 33/48* (2010.01)

(52) U.S. Cl.
  CPC ............ *H01L 33/505* (2013.01); *H01L 33/60* (2013.01); *G02B 6/0068* (2013.01); *G02B 6/0083* (2013.01); *H01L 33/486* (2013.01); *H01L 2224/16225* (2013.01)

(56) References Cited

U.S. PATENT DOCUMENTS

| | | | | |
|---|---|---|---|---|
| 2005/0110032 | A1* | 5/2005 | Saito | G02B 6/0046 257/98 |
| 2005/0167682 | A1* | 8/2005 | Fukasawa | H01L 33/60 257/79 |
| 2007/0274096 | A1* | 11/2007 | Chew | F21V 31/04 362/609 |
| 2008/0002428 | A1* | 1/2008 | Byun | G02B 6/0016 362/608 |
| 2011/0069256 | A1* | 3/2011 | Ohkubo | H01L 33/46 349/67 |
| 2013/0279195 | A1 | 10/2013 | Ahn et al. | |
| 2015/0034987 | A1* | 2/2015 | Hayashi | H01L 33/60 257/98 |

FOREIGN PATENT DOCUMENTS

| | | |
|---|---|---|
| CN | 102208401 | 10/2011 |
| CN | 202256962 | 5/2012 |
| CN | 103247741 | 8/2013 |
| JP | 2001184923 | 7/2001 |
| JP | 2003066239 | 3/2003 |
| JP | 2011-082590 | 4/2011 |
| JP | 2013-072905 | 4/2013 |
| KR | 10-2012-0006876 | 1/2012 |
| KR | 10-2012-0077414 | 7/2012 |
| KR | 10-1231484 | 2/2013 |
| TW | 201245822 | 11/2012 |

OTHER PUBLICATIONS

Chinese Office Action dated Apr. 11, 2019, issued in Chinese Patent Application No. 201480065296.3.

* cited by examiner

LIGHT SOURCE MODULE AND BACKLIGHT UNIT HAVING THE SAME

CROSS-REFERENCE TO RELATED APPLICATIONS

This application is the national stage of International Application No. PCT/KR2014/009214, filed on Sep. 30, 2014, and claims priority from and the benefit of Korean Patent Application No. 10-2013-0116633, filed on Sep. 30, 2013, and Korean Patent Application No. 10-2014-0131772, filed on Sep. 30, 2014, which are incorporated herein by reference for all purposes as if fully set forth herein.

BACKGROUND

Field

Exemplary embodiments of the present disclosure relate to a light source module and a backlight unit including the same, and, more particularly, to a light source module providing good luminous efficacy while realizing a slim structure and improved external appearance, and a backlight unit including the same.

Discussion of the Background

A typical backlight unit is generally used in surface lighting devices for providing light to a liquid crystal display.

A backlight unit provided to the liquid crystal display is classified into a direct type and an edge type according to locations of light emitting devices.

Development of the direct type backlight unit has started with the advent of liquid crystal displays of 20" or more, and the direct type backlight unit includes a plurality of light sources disposed on a lower surface of a diffusing plate, such that an entire surface of a liquid crystal display panel is directly illuminated with light emitted from the light sources. Such a direct type backlight unit has higher efficiency in use of light than the edge type backlight unit and is generally used in large liquid crystal displays requiring high brightness.

The edge type backlight unit is generally applied to relatively small liquid crystal displays, such as monitors for laptop computers and desktop computers, and has advantages in terms of good uniformity of light, long lifespan, and thickness of liquid crystal displays.

Recently, a novel edge type backlight unit wherein light emitting diode packages providing advantages in terms of low power consumption and a slim structure are mounted on a substrate and disposed on an inner surface of the backlight unit is proposed in the related art.

However, the edge type backlight unit including the light emitting diode packages has a limitation in thickness reduction of the backlight unit with gradually increasing demand for a slimmer backlight unit, and has difficulty in use of highly efficient light emitting diode chips due to deterioration in heat dissipation by the light emitting diode packages.

SUMMARY

Exemplary embodiments of the present disclosure provide a light source module and a backlight unit including the same, in which a light guide plate includes a receiving portion for receiving a light emitting diode chip, thereby realizing slimness of the backlight unit while improving luminous efficacy thereof.

Exemplary embodiments of the present disclosure provide a light source module and a backlight unit including the same, in which an incident plane of a light guide plate is formed to face an exit plane of a light emitting diode chip, thereby improving luminous efficacy.

In accordance with one exemplary embodiment, a light source module includes: a light emitting diode chip electrically connected to a substrate through a bottom surface thereof; a wavelength conversion portion formed on the light emitting diode chip; a reflective portion formed on the light emitting diode chip, wherein the reflective portion exposes at least one plane of the wavelength conversion portion to form an exit plane through which light emitted from the light emitting diode chip is discharged.

The light source module according to this exemplary embodiment includes a plurality of light emitting diode chips arranged therein.

In the light source module according to this exemplary embodiment, the light emitting diode chip is mounted on the substrate through flip-chip bonding or surface mount technology (SMT).

In the light source module according to this exemplary embodiment, the light emitting diode chip includes: a first semiconductor layer doped with a first conductive type dopant; an active layer formed under the first semiconductor layer; a second semiconductor layer doped with a second conductive type dopant and formed under the active layer; a first electrode electrically connected to the first semiconductor layer; a second electrode electrically connected to the second semiconductor layer; a first electrode pad electrically connected to the first electrode; and a second electrode pad electrically connected to the second electrode, and may be electrically connected to the substrate through the first electrode pad and the second electrode pad.

In accordance with another exemplary embodiment, a light source module includes: a light emitting module including a plurality of light emitting diode chips including a wavelength conversion portion and arranged in one direction, and a reflective portion formed on the light emitting diode chips, wherein the plurality of light emitting diode chips is electrically connected to a substrate through bottom surfaces thereof and the reflective portion exposes at least one plane of the light emitting module to form an exit plane through which light emitted from the light emitting module is discharged.

In the light source module according to this exemplary embodiment, the light emitting module has a rectangular parallelepiped shape and at least two of the light emitting diode chips are arranged in a major axis direction of the light emitting module.

In the light emitting module according to this exemplary embodiment, at least one of the light emitting diode chips is arranged in a minor axis direction of the light emitting module.

In accordance with a further exemplary embodiment, a backlight unit includes: a light guide plate; and a light source module disposed on at least one side of the light guide plate and emitting light, wherein the light source module includes a light emitting diode chip electrically connected to a substrate through a bottom surface thereof; a wavelength conversion portion formed on the light emitting diode chip; and a reflective portion formed on the light emitting diode chip, the reflective portion exposing at least one plane of the wavelength conversion portion to form an exit plane through which light emitted from the light emitting diode chip is discharged.

In the backlight unit according to this exemplary embodiment, the light guide plate includes a receiving portion receiving the light source module, and the receiving portion includes an incident plane facing the exit plane of the light source module.

In the backlight unit according to this exemplary embodiment, the receiving portion is provided to at least one corner of the light guide plate.

In the backlight unit according to this exemplary embodiment, the reflective portion forms at least two planes adjoining each other as exit planes and the receiving portion includes at least two incident planes facing the two exit planes.

In the backlight unit according to this exemplary embodiment, the receiving portion is provided to at least one side of the light guide plate.

In the backlight unit according to this exemplary embodiment, the reflective portion forms at least three planes adjoining each other as exit planes and the receiving portion includes at least three incident planes facing the three exit planes.

In the backlight unit according to this exemplary embodiment, the light source module includes a plurality of light emitting diode chips arranged therein.

In the backlight unit according to this exemplary embodiment, the light emitting diode chip is mounted on the substrate by flip-chip bonding or surface mount technology (SMT).

In the backlight unit according to this exemplary embodiment, the light emitting diode chip includes: a first semiconductor layer doped with a first conductive type dopant; an active layer formed under the first semiconductor layer; a second semiconductor layer doped with a second conductive type dopant and formed under the active layer; a first electrode electrically connected to the first semiconductor layer; a second electrode electrically connected to the second semiconductor layer; a first electrode pad electrically connected to the first electrode; and a second electrode pad electrically connected to the second electrode, and may be electrically connected to the substrate through the first electrode pad and the second electrode pad.

In accordance with yet another exemplary embodiment, a backlight unit includes: a light guide plate; and a light source module disposed on at least one side of the light guide plate and emitting light, wherein the light source module includes a plurality of light emitting diode chips including a wavelength conversion portion and arranged in one direction to be electrically connected to a substrate through a bottom surface thereof, and a reflective portion formed on the light emitting diode chips, and the reflective portion exposes at least one plane of the light emitting module to form an exit plane through which light emitted from the light emitting module is discharged.

Exemplary embodiments of the present disclosure provide a light source module and a backlight unit including the same, in which a light guide plate includes a receiving portion for receiving a light emitting diode chip, thereby realizing slimness of the backlight unit while improving luminous efficacy thereof.

Exemplary embodiments of the present disclosure provide a light source module and a backlight unit including the same, in which an incident plane of a light guide plate is formed to face an exit plane of a light emitting diode chip, thereby improving luminous efficacy.

DETAILED DESCRIPTION OF THE ILLUSTRATED EMBODIMENTS

Figure 1:
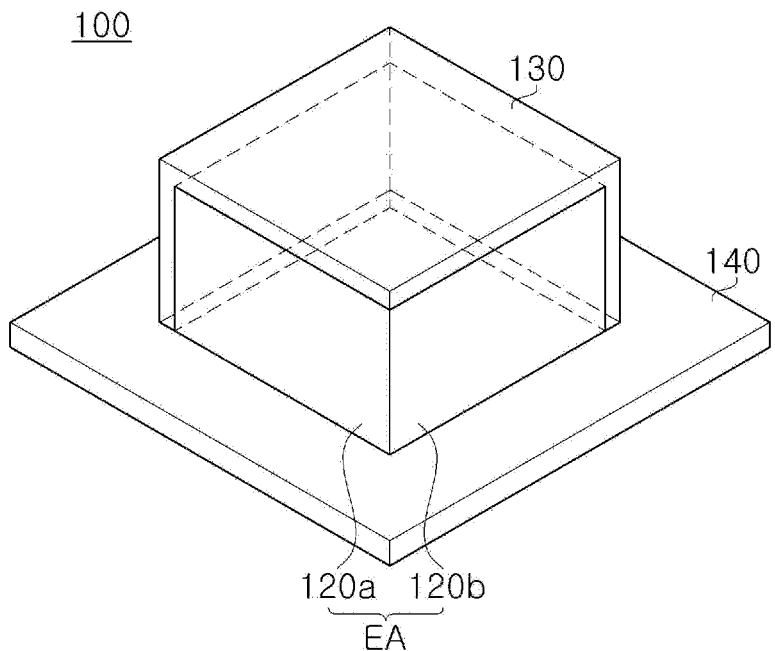
FIG. 1 is a perspective view of a light source module according to an exemplary embodiment of the present disclosure.

Hereinafter, exemplary embodiments of the present disclosure will be described in detail with reference to the accompanying drawings. The following embodiments are provided by way of example so as to fully convey the spirit of the present disclosure to those skilled in the art. Accordingly, the present disclosure is not limited to the embodiments disclosed herein and can also be implemented in different forms. In the drawings, widths, lengths, thicknesses, and the like of elements can be exaggerated for clarity and descriptive purposes. Throughout the specification, like reference numerals denote like elements having the same or similar functions. It should be understood that various modifications, changes, and alterations can be made without departing from the spirit and scope of the present disclosure, as limited only by the appended claims and equivalents thereof Hereinafter, exemplary embodiments of the present disclosure will be described in detail with reference to the accompanying drawings so as to be easily realized by those skilled in the art to which the present disclosure pertains.

Figure 2:
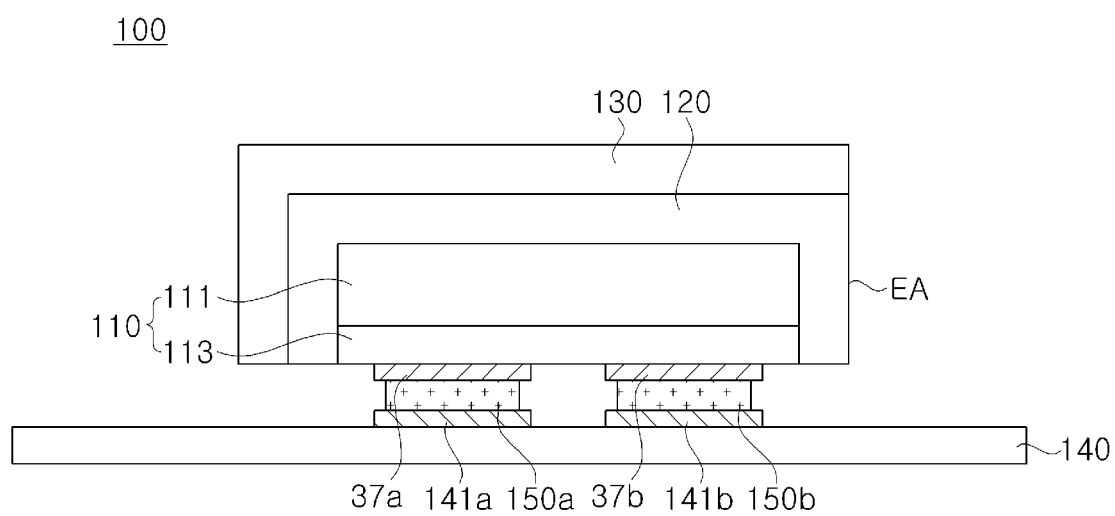
FIG. 2 is a side-sectional view of the light source module according to an exemplary embodiment of the present disclosure.

FIG. 1 is a perspective view of a light source module according to an exemplary embodiment of the present disclosure and FIG. 2 is a side-sectional view of the light source module according to an exemplary embodiment of the present disclosure.

Referring to FIG. 1 and FIG. 2, a light source module 100 according to an exemplary embodiment includes a light emitting diode chip 110, a wavelength conversion portion 120, a reflective portion 130, and a circuit board 140.

The circuit board 140 includes substrate pads 141a, 141b electrically connected to the light emitting diode chip 110, and bumps 150a, 150b disposed on the substrate pads 141a, 141b. The circuit board 140 may be a metal printed circuit board (PCB) having an advantage in terms of heat dissipation, without being limited thereto. The circuit board 140 may have a bar shape having a major axis and a minor axis.

Figure 7:
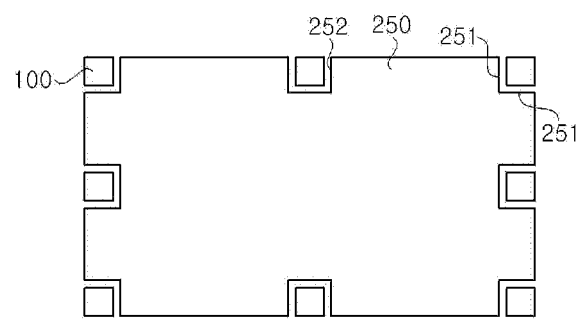
FIG. 7 is a plan view of a light source module and a light guide plate according to another exemplary embodiment of the present disclosure.
Figure 9:
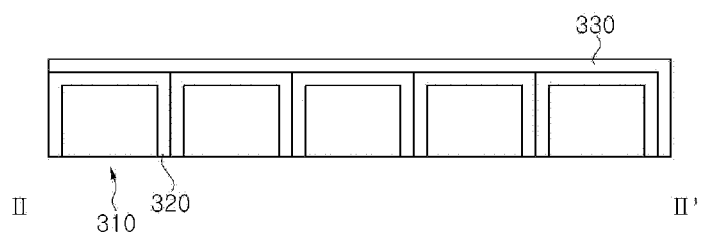
FIG. 9 is a cross-sectional view of a light emitting diode chip taken along line II-II' of FIG. 8.

Although the light source module is illustrated as having a single light emitting diode chip in this exemplary embodiment, the light source module may include a plurality of light emitting diode chips arranged therein in other exemplary embodiments, as shown in FIG. 7 and FIG. 9.

The light emitting diode chip 110 includes a growth substrate 111 and a semiconductor stack 113. The light emitting diode chip 110 may be directly mounted on the circuit board 140 by flip bonding or surface mount technology (SMT) to be electrically connected to the circuit board 140. In this exemplary embodiment, electrode pads 37*a*, 37*b* exposed on a lower surface of the light emitting diode chip 110 are electrically connected to the substrate pads 141*a*, 141*b* via bumps 150*a*, 150*b*. In this exemplary embodiment, since the light source module 100 does not use a wire, the light source module 100 does not require a molding portion for protection of the wire and partial removal of the wavelength conversion portion 120 to expose bonding pads. Accordingly, the light source module according to the exemplary embodiment adopts the flip-chip type light emitting diode chip, thereby preventing generation of color deviation or bright spots while simplifying a fabrication process, as compared with a light source module employing a light emitting diode chip using a bonding wire.

The wavelength conversion portion 120 is formed on the light emitting diode chip 110. That is, the wavelength conversion portion 120 may surround not only an exit plane EA of the light emitting diode chip 110 but also an upper surface and side surfaces thereof. As used herein, the exit plane EA refers to a plane of the light emitting diode chip 110 through which light emitted from the light emitting diode chip 110 is discharged. That is, the wavelength conversion portion 120 may be formed on the light emitting diode chip 110 including a plane corresponding to the exit plane EA, only on some planes of the light emitting diode chip 110 including the exit plane EA, or on all of the upper and side surfaces of the light emitting diode chip 110 in other exemplary embodiments.

The wavelength conversion portion 120 includes phosphors. The phosphors can convert wavelengths of light emitted from the light emitting diode chip 110. The wavelength conversion portion 120 is coated onto the light emitting diode chip 110 such that the upper surface and side surfaces of the light emitting diode chip 110 are covered by the wavelength conversion portion 120 with a constant thickness. A region of the wavelength conversion portion 120 covering the upper surface of the light emitting diode chip 110 may have the same or different thickness than a region of the wavelength conversion portion 120 covering the side surfaces of the light emitting diode chip 110. In addition, a region of the wavelength conversion portion 120 covering the exit plane EA through which light exits may have a different thickness than a region of the wavelength conversion portion 120 covering the side surfaces and upper surface of the light emitting diode chip 110 excluding the exit plane EA.

The reflective portion 130 covers an upper surface and side surfaces of the wavelength conversion portion 120 excluding at least one plane of the light emitting diode chip 110, which is defined as the exit plane EA, (for example, planes 120*a*, 120*b* when the light emitting diode chip includes two exit planes). The reflective portion 130 serves to reflect light, which is subjected to wavelength conversion through the wavelength conversion portion 120, towards the exit plane EA. That is, the reflective portion 130 serves to guide light to be discharged through the exit plane EA of the light source module 100. That is, the reflective portion 130 is formed on other planes excluding the exit plane EA of the light source module 100, thereby providing a function of guiding light to be discharged through the exit plane EA of the light source module 100.

The reflective portion 130 may be directly formed on the light emitting diode chip 110, and in some exemplary embodiments, the reflective portion 130 may be formed after formation of the wavelength conversion portion 120 on the light emitting diode chip 110.

The light source module 100 according to the exemplary embodiment can concentrate light in the direction of the exit plan EA of the light source module 100 using the reflective portion 130 formed on the light emitting diode chip 110 and exposing at least one plane of the light emitting diode chip 110 as the exit plane EA.

In the light source module 100, the light emitting diode chip 110 is directly mounted on the circuit board 140 through flip bonding or SMT, thereby realizing high efficiency and miniaturization of the light source module 100, as compared with a typical package type light source module using a wire.

Furthermore, the light source module 100 according to the exemplary embodiment is advantageous in terms of thickness reduction, as compared with a typical package type light source module using a wire.

Figure 3:
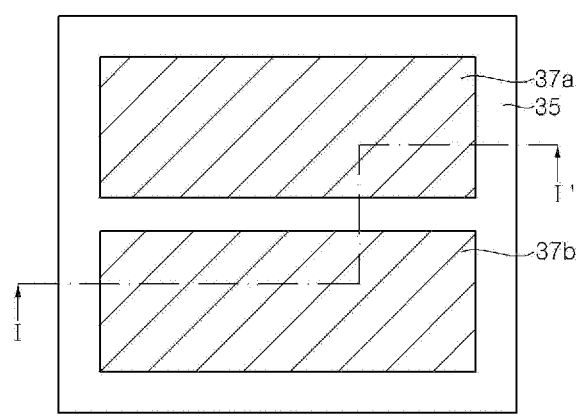
FIG. 3 is a plan view of a light emitting diode chip shown in FIG. 1.
Figure 4:
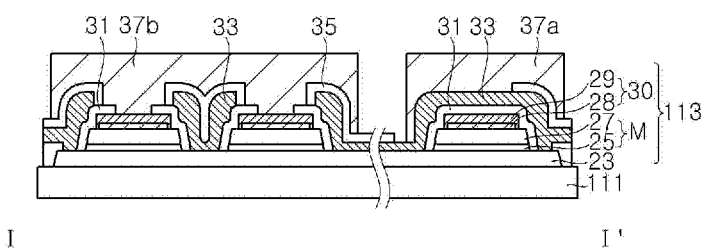
FIG. 4 is a cross-sectional view of the light emitting diode chip taken along line I-I' of FIG. 3.

Referring to FIG. 3 and FIG. 4, the structure of the light emitting diode chip will be described in more detail.

FIG. 3 is a plan view of the light emitting diode chip shown in FIG. 1 and FIG. 4 is a cross-sectional view of the light emitting diode chip taken along line I-I' of FIG. 3.

Referring to FIG. 3 and FIG. 4, the light emitting diode chip according to the exemplary embodiment includes a growth substrate 111 and a semiconductor stack 113.

The semiconductor stack 113 includes a first conductive type semiconductor layer 23 formed on the growth substrate 111 and a plurality of mesas M formed on the first conductive type semiconductor layer 23 and separated from each other.

Each of the mesas M includes an active layer 25 and a second conductive type semiconductor layer 27. The active layer 25 is interposed between the first conductive type semiconductor layer 23 and the second conductive type semiconductor layer 27. The light emitting diode chip includes reflective electrodes 30 on each of the mesas M.

As shown in the drawings, the plural mesas M have an elongated shape and extend parallel to each other in one direction. With this structure, the plurality of mesas M having the same shape can be easily formed in a plurality of chip regions on the growth substrate 111.

The reflective electrodes 30 may be formed on each of the mesas M after the plurality of mesas M is formed, without being limited thereto. Alternatively, the reflective electrodes 30 may be formed on the second conductive type semiconductor layer 27 after growth of the second conductive type semiconductor layer 27, and before formation of the mesas M. The reflective electrodes 30 cover substantially the entire upper surface of each of the mesas M and have substantially the same shape as the shape of the mesa M in plan view.

The reflective electrodes 30 include a reflective layer 28 and may further include a barrier layer 29. The barrier layer 29 may cover an upper surface and side surfaces of the reflective layer 28. For example, the barrier layer 29 may be formed to cover the upper and side surfaces of the reflective layer 28 by forming a pattern of the reflective layer 28, followed by forming the barrier layer 29 thereon. For example, the reflective layer 28 may be formed through deposition and pattering of Ag, Ag alloy, Ni/Ag, Ni/Zn/Ag, or TiO/Ag layers. The barrier layer 29 may be formed of Ni, Cr, Ti, Pt, Rd, Ru, W, Mo, TiW, or combinations thereof and prevents metallic materials of the reflective layer 28 from diffusing or being contaminated.

After formation of the plurality of mesas M, an edge of the first conductive type semiconductor layer 23 may also be etched. As a result, an upper surface of the growth substrate 111 can be exposed. A side surface of the first conductive type semiconductor layer 23 may be slanted.

The light emitting diode chip according to the exemplary embodiment further includes a lower insulation layer 31 covering the plurality of mesas M and the first conductive type semiconductor layer 23. The lower insulation layer 31 has openings that allow electrical connection to the first conductive type semiconductor layer 23 and the second conductive type semiconductor layer 27 in a predetermined region. For example, the lower insulation layer 31 may include openings that expose the first conductive type semiconductor layer 23 and openings that expose the reflective electrodes 30.

The openings may be placed in a region between the mesas M and near the edge of the reflective electrodes 30, and may have an elongated shape extending along the mesas M. The openings are restrictively disposed on the mesas M and placed near the same side of the mesas.

The light emitting diode chip according to the exemplary embodiment includes a current spreading layer 33 formed on the lower insulation layer 31. The current spreading layer 33 covers the plurality of mesas M and the first conductive type semiconductor layer 23. The current spreading layer 33 includes openings placed in an upper region of the mesas M and exposing the reflective electrodes 30. The current spreading layer 33 may form ohmic contact with the first conductive type semiconductor layer 23 through the openings of the lower insulation layer 31. The current spreading layer 33 is insulated from the plurality of mesas M and the reflective electrodes 30 by the lower insulation layer 31.

The openings of the current spreading layer 33 have a larger area than the openings of the lower insulation layer 31 in order to prevent the current spreading layer 33 from being connected to the reflective electrodes 30.

The current spreading layer 33 is formed on a substantially entire upper region of the growth substrate 111 excluding the openings. With this structure, the light emitting diode chip can achieve easy current spreading through the current spreading layer 33. The current spreading layer 33 may include a highly reflective metal layer such as an Al layer, which may be formed on a bonding layer such as a Ti, Cr or Ni layer. In addition, a protective layer of Ni, Cu or Au having a single layer structure or a combination layer thereof may be formed on the highly reflective metal layer. The current spreading layer 33 may have a multilayer structure of, for example, Ti/Al/Ti/Ni/Au.

The light emitting diode chip according to the exemplary embodiment includes an upper insulation layer 35 formed on the current spreading layer 33. The upper insulation layer 35 includes an opening that exposes the current spreading layer 33 and openings that expose the reflective electrodes 30.

The upper insulation layer 35 may be formed using an oxide insulation layer, a nitride insulation layer, a mixed layer, or alternative layers of these insulation layers, or a polymer such as polyimide, Teflon, and Parylene.

A first electrode pad 37a and a second electrode pad 37b are formed on the upper insulation layer 35. The first electrode pad 37a is connected to the current spreading layer 33 through the openings of the upper insulation layer 35 and the second electrode pad 37b is connected to the reflective electrodes 30 through the openings of the upper insulation layer 35. The first electrode pad 37a and the second electrode pad 37b may be used as pads for bump connection or SMT upon mounting a light emitting diode on a circuit board or the like.

The first and second electrode pads 37a, 37b may be simultaneously formed by the same process, for example, photolithography and etching technology or lift-off technology. The first and second electrode pads 37a, 37b may include a bonding layer, such as a Ti, Cr, or Ni layer, and a highly conductive metal layer, such as an Al, Cu, Ag or Au layer. The first and second electrode pads 37a, 37b may be formed such that distal ends thereof are placed on the same plane, thereby allowing the light emitting diode chip to be flip bonded to conductive patterns having the same height on the circuit board.

Then, the growth substrate 111 is divided into individual light emitting diode chip units, thereby providing light emitting diode chips. The growth substrate 111 may be removed from the light emitting diode chips before or after dividing into individual light emitting diode chip units.

As such, the light emitting diode chip according to the exemplary embodiment directly flip bonded to the circuit board can realize high efficiency and miniaturization as compared with typical package type light emitting diodes.

Figure 5:
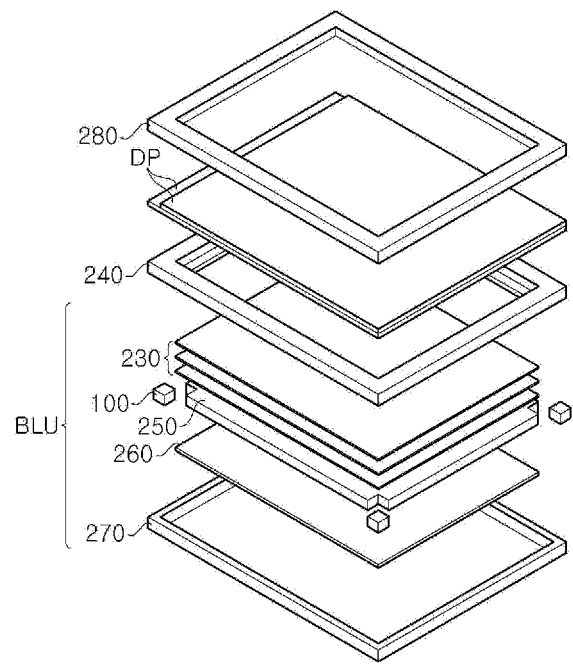
FIG. 5 is an exploded perspective view of a display including a backlight unit according to an exemplary embodiment of the present disclosure.
Figure 6:
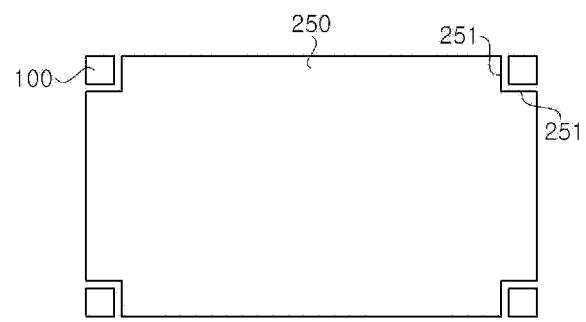
FIG. 6 is a plan view of a light source module and a light guide plate shown in FIG. 5.

FIG. 5 is an exploded perspective view of a display including a backlight unit according to an exemplary embodiment of the present disclosure, and FIG. 6 is a plan view of a light source module and a light guide plate shown in FIG. 5.

Referring to FIG. 5 and FIG. 6, a display according to an exemplary embodiment includes a display panel DP on which an image is displayed, a backlight unit BLU disposed at a rear side of the display panel DP and emitting light, a frame 240 supporting the display panel DP and receiving the backlight unit BLU, and a top cover 280 surrounding the display panel DP.

The display panel DP includes a color filter substrate and a thin film transistor substrate disposed to face each other and coupled to each other, so as to maintain a uniform cell gap therebetween. In some exemplary embodiments, the display panel DP may further include a liquid crystal layer between the color filter substrate and the thin film transistor substrate.

Although not shown in detail, the thin film transistor substrate includes a plurality of gate lines and a plurality of data lines intersecting each other to define pixels therebetween, and a thin film transistor disposed in each intersection regions between the gate lines and the data lines and connected in one-to-one correspondence to a pixel electrode mounted on each of the pixels. The color filter substrate includes RGB color filters corresponding to each of the pixels, a black matrix forming a frame of each of the color filters while covering the gate lines, the data lines, and the thin film transistors, and a common electrode covering all of these components. In other exemplary embodiments, the common electrode may be formed on the thin film transistor substrate.

The backlight unit BLU provides light to the display panel DP, and includes a lower cover 270 open at an upper side thereof, a light source module 100 disposed at a corner of the lower cover 270, and a light guide plate 250 disposed parallel to the light source module 100 and converting spot light into sheet light.

In addition, the backlight unit BLU includes optical sheets 230 disposed on the light guide plate 250 to diffuse and collect light, and a reflective sheet 260 disposed under the light guide plate 250 and reflecting light that travels in a downward direction of the light guide plate 250 to towards the display panel DP.

The light source module 100 emits light through adjoining exit planes. As shown in FIG. 6, the exit planes of the light source module 100 may be defined by two side surfaces thereof. In this exemplary embodiment, the light source module 100 is placed at each corner of the light guide plate 250.

The light guide plate 250 includes a receiving portion 251 formed on at least one corner thereof and corresponding to the light source module 100. The receiving portion 251 has a concave shape corresponding to the shape of the light source module 100. Specifically, the receiving portion 251 includes a plane on which light emitted from the light source module 100 is incident, and this plane faces the exit plane EA and can be defined as an incident plane.

Although the light source modules 100 are illustrated as being placed at each of the four corners of the light guide plate 250 in this exemplary embodiment, it should be understood that the present disclosure is not limited thereto, and the light source module 100 may be provided to at least one corner of the light guide plate 250, which adjoin one surface of the light guide plate 250. Further, the light source module 100 may include a plurality of light emitting diode chips as a module therein.

According to another exemplary embodiment, the exit planes of the light source module 100 may be defined by three side surfaces thereof, as shown in FIG. 7. In this exemplary embodiment, the light source modules 100 are placed to correspond to each side of the light guide plate 250, in addition to the four corners of the light guide plate 250.

The light guide plate 250 includes receiving portions 251, 252 in some regions of the side thereof corresponding to the light source module 100. Each of the receiving portions 251, 252 has a concave shape corresponding to the shape of the light source module 100 and may be formed in plural at the center of the side of the light guide plate 250. Specifically, the receiving portions 251, 252 include planes on which light emitted from the light source module 100 is incident, and each of these planes faces the exit plane EA and can be defined as an incident plane. In this exemplary embodiment, three incident planes may be formed to face three exit planes.

Although the light source module 100 is illustrated as having the receiving portion 252 formed at the center of each of four sides of the light guide plate 250 in this exemplary embodiment, it should be understood that the present disclosure is not limited thereto and the light source module 100 may be provided to at least one side of the light guide plate 250, which adjoins one surface of the light guide plate 250, and may be formed in other regions of the side, instead of being formed at the center thereof. Further, the light source module 100 may include a plurality of light emitting diode chips as a module therein.

Although the number of exit planes and the number of incident planes are illustrated as two and three in the above exemplary embodiments, it should be understood that the present disclosure is not limited thereto and the number of exit planes or incident planes may range from one to five.

As such, in the backlight unit BLU according to the exemplary embodiments of the present disclosure, the light source modules 100 are provided to the corners of the light guide plate 250, thereby enabling reduction in the number of light emitting diode chips while improving an external appearance by realizing slimness of the backlight unit BLU and minimization of a non-display region at an edge of the backlight unit BLU, as compared with a typical backlight unit.

The light source module includes 100 the light emitting diode chips directly mounted on a circuit board through flip bonding or SMT, thereby realizing high efficiency and miniaturization, as compared with a typical package type light source module using a wire.

Figure 8:
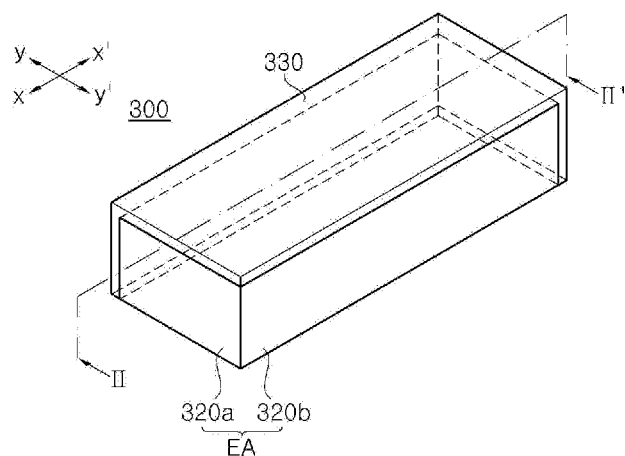
FIG. 8 is a perspective view of a light source module according to a further exemplary embodiment of the present disclosure.

FIG. 8 is a perspective view of a light source module according to a further exemplary embodiment of the present disclosure and FIG. 9 is a cross-sectional view of a light emitting diode chip taken along line II-II' of FIG. 8.

Figure 10:
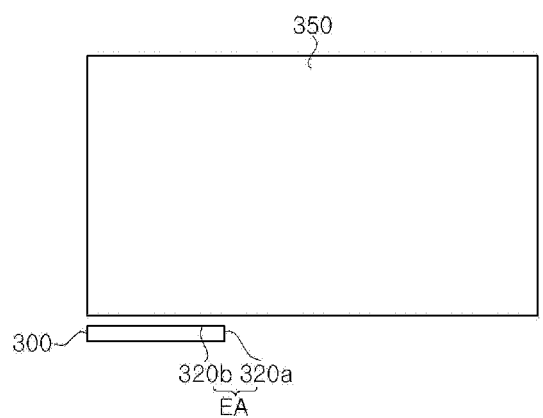
FIG. 10 is a plan view of the light source module and a light guide plate shown in FIG. 8.
Figure 11:
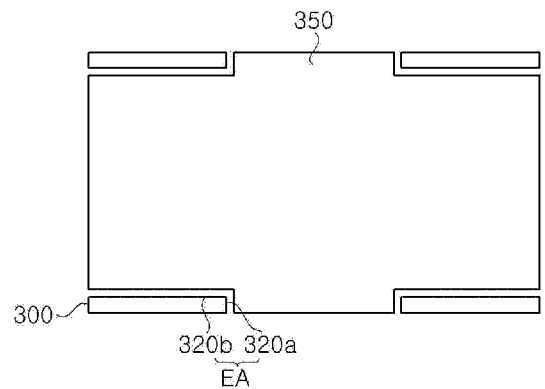
FIG. 11 is a plan view of the light source module and the light guide plate according to the exemplary embodiment of the present disclosure.

FIG. 10 and FIG. 11 are plan views of the light source module according to exemplary embodiments and a light guide plate including the same.

Referring to FIG. 8 to FIG. 11, a light source module 300 according to a further exemplary embodiment may include a plurality of light emitting diode chips 310 arranged in one direction. That is, two or more light emitting diode chips 310 may be arranged in a longitudinal direction of a light emitting module 300. Herein, the longitudinal direction of the light emitting module 300 can be defined as a major axis direction x-x' thereof. Although not shown in detail, at least one light emitting diode chip 310 may be arranged in a minor axis direction y-y' of the light emitting module 300. The number of light emitting diode chips 310 may be set in various ways depending upon the size or brightness of the backlight unit. A wavelength conversion portion 320 and a reflective portion 330 may be formed on the plurality of light emitting diode chips 310, as described above.

According to yet another exemplary embodiment, the light source module 300 includes a plurality of light emitting diode chips 310 including a wavelength conversion portion 320 and arranged in one direction thereof. That is, two or more light emitting diode chips 310 may be arranged in the longitudinal direction of the light emitting module 300. Herein, the longitudinal direction of the light emitting module 300 can be defined as a major axis direction x-x' thereof. Although not shown in detail in the drawings, at least one light emitting diode chip 310 may be arranged in a minor axis direction y-y' of the light emitting module 300. The number of light emitting diode chips 310 may be set in various ways depending upon the size or brightness of the backlight unit.

The light source module 300 includes a reflective portion 330 covering the light emitting module 300. The reflective portion 330 covers an upper surface and side surfaces of the light emitting module 300. The reflective portion 330 expose two side surfaces 320a, 320b of the light emitting module 300, which adjoin each other. The side surfaces 320a, 320b exposed by the reflective portion 330 can be defined as exit planes EA.

The light source module 300 is placed at one side adjacent one corner of a light guide plate 350. Specifically, the light source module 300 is placed near one corner of the light guide plate 350 and is parallel to one of side surfaces of the light guide plate 350, which adjoin the corner thereof. In addition, the light source module 300 may be placed parallel to some region of the side surface.

In the light source module 300 according to the exemplary embodiment, the plurality of light emitting diode chips 310 is provided in the form of a light emitting module 300, whereby the backlight unit according to the exemplary embodiment can reduce the number of light source modules 300, as compared with a typical backlight unit, and can realize a slim structure while reducing a non-display region of the backlight unit by minimizing an installation region of the light source module 300, thereby improving an external appearance.

Figure 12:
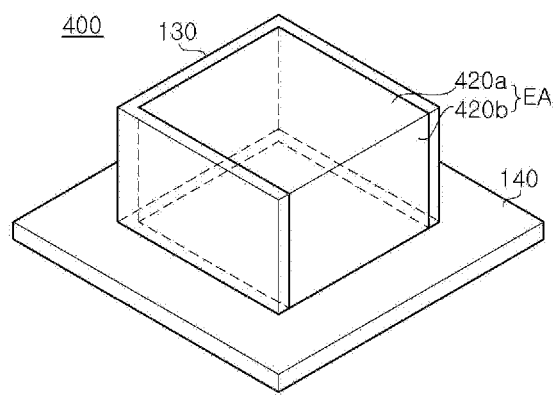
FIG. 12 is a perspective view of a light source module according to yet another exemplary embodiment of the present disclosure.
Figure 13:
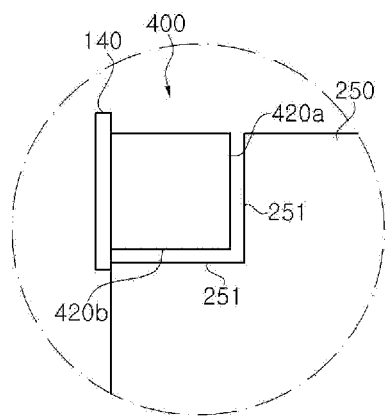
FIG. 13 is a view of the light source module and the light guide plate shown in FIG. 12.

FIG. 12 is a perspective view of a light source module according to yet another exemplary embodiment of the present disclosure, and FIG. 13 is a view of the light source module and the light guide plate shown in FIG. 12.

Referring to FIG. 12 and FIG. 13, a light source module 400 according to this exemplary embodiment includes a light emitting diode chip, a wavelength conversion portion, and a reflective portion 130.

The light emitting diode chip and the circuit board 140 are the same as those of the light source modules according to the above exemplary embodiment, and detailed descriptions thereof will be omitted.

The wavelength conversion portion covers the light emitting diode chip on the circuit board 140. The wavelength conversion portion may surround an upper surface and side surfaces of the light emitting diode chip and include phosphors.

The reflective portion 130 exposes an upper surface and a side surface of the wavelength conversion portion corresponding to an upper surface 420a and a side surface 420b of the light emitting diode chip, which are defined as exit planes EA and adjoin each other. The reflective portion 130 serves to reflect light, which is subjected to wavelength conversion through the wavelength conversion portion, towards the exit planes EA. That is, the reflective portion 130 serves to guide light to be concentrated on the upper surface 420a and the side surface 420b of the light source module 400.

As such, the light source module 400 according to the exemplary embodiment can concentrate light towards the upper surface 420a and the side surface 420b of the light source module 400 using the reflective portion 130 exposing the upper surface 420a and the side surface 420b adjoining each other.

The exit planes EA of the light source module 400 correspond to the receiving portion 251 at a corner of the light guide plate 250. The receiving portion 251 has a concave shape corresponding to the light source module 400. Specifically the receiving portion 251 includes two side surfaces adjoining each other and receiving light emitted from the light source module 400. The two side surfaces of the receiving portion 251 can be defined as incident planes.

Although not shown in the drawings, the light source module 400 may include at least two light emitting diode chips. The at least two light emitting diode chips may be arranged in the longitudinal direction of the upper surface 420a of the light source module 400. In addition, at least two light emitting diode chips may be arranged in the longitudinal direction of the side surface 420a.

As such, according to the exemplary embodiment, the light source module 400 is provided at the corner of the light guide plate 250, thereby enabling reduction in the number of light emitting diode chips while improving an external appearance through slimness of the backlight unit and minimization of a non-display region at an edge of the backlight unit, as compared with a typical backlight unit.

Furthermore, in the light source module 400 according to the exemplary embodiment, the light emitting diode chips are directly mounted on the circuit board 140 through flip bonding or SMT, thereby realizing high efficiency and miniaturization of the light source module 400, as compared with a typical package type light source module using a wire.

Although some exemplary embodiments have been described above, it should be understood that the present disclosure is not limited to a particular exemplary embodiment. Further, it should be understood that some features of a certain embodiment may also be applied to other embodiments without departing from the spirit and scope of the invention.

The invention claimed is:

1. A light source module, comprising:
   a light emitting diode chip electrically connected to a substrate through a bottom surface thereof;
   a wavelength conversion portion disposed on the light emitting diode chip; and
   a reflective portion disposed on the light emitting diode chip,
   wherein:
   the reflective portion exposes at least one plane of the wavelength conversion portion to form an exit plane through which light emitted from the light emitting diode chip is discharged;
   the light emitting diode chip comprises an upper surface, a lower surface, and side surfaces;
   the wavelength conversion portion covers the upper surface and the side surfaces of the light emitting diode chip;
   the wavelength conversion portion comprises an upper surface, a lower surface, side surfaces, and light-discharged surfaces opposite the side surfaces; and
   the reflective portion covers the wavelength conversion portion; and
   an end of the wavelength conversion portion and the reflective portion covering one of the side surfaces of the light emitting diode chip opposite to the light-discharged surface of the wavelength conversion portion are spaced apart from an upper surface of the substrate.

2. The light source module of claim 1, wherein the light source module comprises light emitting diode chips.

3. The light source module of claim 1, wherein the light emitting diode chip is mounted on the substrate through flip-chip bonding or surface mount technology (SMT).

4. The light source module of claim 1, wherein the light emitting diode chip comprises:
   a first semiconductor layer doped with a first conductive type dopant;
   an active layer disposed on the first semiconductor layer;
   a second semiconductor layer doped with a second conductive type dopant and disposed on the active layer;
   a first electrode electrically connected to the first semiconductor layer;
   a second electrode electrically connected to the second semiconductor layer;
   a first electrode pad electrically connected to the first electrode; and
   a second electrode pad electrically connected to the second electrode,
   wherein the light emitting diode chip is electrically connected to the substrate through the first electrode pad and the second electrode pad.

5. A light source module, comprising:
   a light emitting module comprising:
   light emitting diode chips arranged in one direction; and a wavelength conversion portion and a reflective portion respectively disposed on the light emitting diode chips, wherein:

the light emitting diode chips are electrically connected to a substrate through bottom surfaces thereof;

the reflective portion exposes at least one plane of the light emitting module to form an exit plane through which light emitted from the light emitting module is discharged;

the wavelength conversion portion comprises a first wavelength conversion portion disposed between a side of one of the light emitting diode chips and the reflective portion covering the side of the one of the light emitting diode chips and a second wavelength conversion portion disposed between adjacent light emitting diode chips; and a thickness of the first wavelength conversion portion is less than a thickness of the second wavelength conversion portion.

6. The light source module of claim 5, wherein:

the light emitting module has a rectangular parallelepiped shape; and at least two of the light emitting diode chips are arranged in a major axis direction of the light emitting module.

7. The light source module of claim 5, wherein at least one of the light emitting diode chips is arranged in a minor axis direction of the light emitting module.

8. A backlight unit, comprising:

a light guide plate; and a light source module disposed on at least one side of the light guide plate and configured to emit light, wherein:

the light source module comprises:

a light emitting diode chip electrically connected to a substrate through a bottom surface thereof;

a wavelength conversion portion disposed on the light emitting diode chip; and a reflective portion disposed on the light emitting diode chip, the reflective portion exposing at least one plane of the wavelength conversion portion to form an exit plane through which light emitted from the light emitting diode chip is discharged;

the light guide plate comprises a receiving portion receiving the light source module; the receiving portion comprising an incident plane facing the exit plane of the light source module;

the receiving portion is formed in at least one corner of the light guide plate;

the reflective portion comprises at least two planes adjoining each other as exit planes;

the receiving portion comprises at least two incident planes facing the two exit planes;

the reflective portion covers an upper portion of the light emitting diode chip; and the upper portion of the light emitting diode chip is not covered by the light guide plate.

9. The backlight unit of claim 8, wherein the receiving portion is formed in at least one side of the light guide plate.

10. The backlight unit of claim 9, wherein:

the reflective portion comprises at least three planes adjoining each other as exit planes; and the receiving portion comprises at least three incident planes facing the three exit planes.

11. The backlight unit of claim 8, wherein the light source module comprises light emitting diode chips.

12. The backlight unit of claim 8, wherein the light emitting diode chip is mounted on the substrate by flip-chip bonding or surface mount technology (SMT).

13. The backlight unit of claim 8, wherein the light emitting diode chip comprises:

a first semiconductor layer doped with a first conductive type dopant;

an active layer disposed on the first semiconductor layer;

a second semiconductor layer doped with a second conductive type dopant and disposed on the active layer;

a first electrode electrically connected to the first semiconductor layer;

a second electrode electrically connected to the second semiconductor layer;

a first electrode pad electrically connected to the first electrode; and a second electrode pad electrically connected to the second electrode, wherein the light emitting diode chip is electrically connected to the substrate through the first electrode pad and the second electrode pad.

14. A backlight unit, comprising:

a light guide plate; and a light source module disposed on at least one side of the light guide plate and configured to emit light, wherein:

the light source module comprises:

light emitting diode chips arranged in one direction and electrically connected to a substrate through a bottom surface thereof; and a wavelength conversion portion and a reflective portion respectively disposed on the light emitting diode chips; and the reflective portion exposes at least one plane of the light emitting module to form an exit plane through which light emitted from the light emitting module is discharged;

the light guide plate comprises a receiving portion receiving the light source module; the receiving portion comprising an incident plane facing the exit plane of the light source module;

the receiving portion is formed in at least one corner of the light guide plate;

the reflective portion comprises at least two planes adjoining each other as exit planes;

the receiving portion comprises at least two incident planes facing the two exit planes;

the reflective portion covers upper portions of the light emitting chips; and the upper portions of the light emitting chips are not covered by the light guide plate.

* * * * *